United States Patent
Simpson et al.

(10) Patent No.: US 8,426,104 B2
(45) Date of Patent: Apr. 23, 2013

(54) NEGATIVE-WORKING IMAGEABLE ELEMENTS

(75) Inventors: Christopher D. Simpson, Osterode (DE); Ursula Müller, Herzberg am Harz (DE); Harald Baumann, Osterode/Harz (DE); Udo Dwars, Herzberg/Harz (DE)

(73) Assignee: Eastman Kodak Company, Rochester, NY (US)

( * ) Notice: Subject to any disclaimer, the term of this patent is extended or adjusted under 35 U.S.C. 154(b) by 637 days.

(21) Appl. No.: 12/575,567

(22) Filed: Oct. 8, 2009

(65) Prior Publication Data

US 2011/0086202 A1    Apr. 14, 2011

(51) Int. Cl.
G03F 7/00 (2006.01)
G03F 7/26 (2006.01)
B41M 5/00 (2006.01)

(52) U.S. Cl.
USPC ...... 430/270.1; 430/302; 101/453; 101/463.1

(58) Field of Classification Search ............... 430/270.1, 430/302; 101/450.1, 453, 463.1
See application file for complete search history.

(56) References Cited

U.S. PATENT DOCUMENTS

| 6,420,089 B1 * | 7/2002 | Baumann et al. | 430/273.1 |
| 8,034,538 B2 * | 10/2011 | Strehmel et al. | 430/281.1 |
| 2006/0046189 A1 * | 3/2006 | Kunita et al. | 430/270.1 |
| 2006/0183049 A1 * | 8/2006 | Teng | 430/270.1 |

FOREIGN PATENT DOCUMENTS

| EP | 1 152 294 | 11/2001 |
| EP | 1 445 655 | 8/2004 |
| EP | 1 450 207 A1 | 8/2004 |
| EP | 1 520 695 A2 | 4/2005 |
| EP | 1520695 A2 * | 4/2005 |
| EP | 1 832 928 | 9/2007 |
| WO | 2009/015467 | 2/2009 |

* cited by examiner

Primary Examiner — Cynthia Kelly
Assistant Examiner — Chanceity Robinson
(74) Attorney, Agent, or Firm — J. Lanny Tucker

(57) ABSTRACT

Negative-working imageable elements can be imaged and processed to provide lithographic printing plates. These imageable elements are sensitive to infrared radiation but are insensitive to "white" light and thus can be more easily handled under white light conditions. These properties are possible by incorporating a filter dye having a $\lambda_{max}$ of from about 300 to about 500 nm into the imageable layer of the imageable elements.

20 Claims, No Drawings

NEGATIVE-WORKING IMAGEABLE ELEMENTS

FIELD OF THE INVENTION

This invention relates to negative-working imageable elements that contain filter dyes in the imageable layer to provide white light safety. This invention also relates to a method of providing imaged and processed elements such as lithographic printing plates.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics. Such compositions are generally provided as imageable layers.

Recent developments in the field of printing plate precursors concern the use of radiation-sensitive compositions that can be imaged by means of lasers or laser diodes, and more particularly, that can be imaged or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

It is known that many imageable elements that are imageable using thermal means such as lasers are insufficiently stable to white light for handling. As a result, such elements cannot be readily handled in room light without fogging or toning in the imageable layer. This instability can be caused by the presence of initiator components that absorb in the spectral region of from 300 to 500 nm. To alleviate this problem, the elements may be handled under "yellow" light or exposed to white light for very short periods of time. These restrictions are not desirable for various manufacturing and printing operations.

It is known that white light stability can be improved by adding a filter dye to layer disposed on the imageable layer. For example, the filter dyes can be incorporated into topcoats (overcoat) or layers between the imageable layer and a topcoat. See for example, EP Publications 1,152,294A1 (Murota et al.), 1,445,655A1 (Takamuki et al.), and 1,832,928A1 (Yamamoto et al.), U.S. Pat. No. 6,420,089 (Baumann et al.), and WO 2009/015467 (Nguyen et al.).

A filter dye is incorporated into an imageable layer in UV-sensitive elements described in EP Publication 1,906,245 A1 (Kawauchi) and the filter dyes have an absorption wavelength that is +50 nm of the sensitizing dye used for UV irradiation.

This is a need to provide white light stability in negative-working imageable elements without the need for an overcoat containing filter dyes since the removed filter dyes contaminate prewash baths and cause an environmental concern in waste water. It is further desired that this white light stability be achieved without a loss of other imaging properties (for example, photospeed).

SUMMARY OF THE INVENTION

The present invention provides a negative-working imageable element comprising a substrate and having thereon an imageable layer that is sensitive to imaging radiation of from about 750 to about 1400 nm, the imageable layer comprising:

(1) an infrared radiation absorbing compound having a $\lambda_{max}$ of from about 750 to about 1400 nm, (2) a polymeric binder, (3) a free radical polymerizable compound, (4) a composition that provides free radicals in response to exposure to infrared radiation, and (5) a filter dye having a $\lambda_{max}$ of from about 300 to about 500 nm and that is present only in the imageable layer in an amount so that the white light stability of the imageable element satisfies the following inequality:

$$WLS > 3(WLS_0)$$

wherein WLS represents the white light stability of the imageable element containing the filter dye, and $WLS_0$ represents the white light stability of an imageable element that is different only in that the filter dye has been omitted.

It also provides a method of providing an imaged element comprising:

A) imagewise exposing the imageable element of the present invention to radiation of from about 750 to about 1400 nm to provide both exposed and non-exposed regions in the imageable layer, and B) removing the non-exposed regions of the imageable layer.

In some embodiments, the imageable layer containing the filter dye is the outermost layer while in other embodiments the imageable layer containing the filter dye is disposed directly under an oxygen barrier topcoat that is the outermost layer. In other embodiments, there can also be an interlayer between the topcoat and the imageable layer containing the filter dye.

The present invention can be used to provide lithographic printing plates from infrared radiation imageable lithographic printing plate precursors. These lithographic printing plates would contain filter dye in the imaged regions of the printing plates.

The present invention solves the problems noted with prior art attempts to provide white light stability. Specifically, it provides a filter dye in the thermally-sensitive imageable layer instead of layers disposed on the imageable layer, for example topcoats or interlayers between the topcoat and imageable layer. Thus, a topcoat can be omitted if desired, or if used, it need not contain filter dyes that contaminant prewash baths. The particular filter dyes used in the invention do not interfere with IR-imaging and do not initiate reactions that cause fogging or toning in the resulting images. The imaging chemistry used in the invention can be based on the generation of either free radicals or acids and thus the invention provides versatility in the type of imaging chemistry for a particular use.

Some imageable elements of this invention are designed for off-press development after imaging while other imageable elements of this invention are designed for on-press development.

DETAILED DESCRIPTION OF THE INVENTION

Definitions

Unless the context indicates otherwise, when used herein, the terms "imageable element", "lithographic printing plate precursor", and "printing plate precursor" are meant to be references to embodiments of in the present invention.

In addition, unless the context indicates otherwise, the various components described herein such as "polymeric binder", free radical generating compounds", "infrared radiation absorbing compound", and similar terms also refer to mixtures of such components. Thus, the use of the articles "a", "an", and "the" is not necessarily meant to refer to only a single component.

By infrared radiation (or "IR") sensitivity, we mean sensitivity primarily (primary absorption) in the electromagnetic spectrum range of from about 700 nm to about 1400 nm, and typically from about 750 nm to about 1250 nm.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The imageable elements include an infrared (IR) radiation-sensitive imaging composition disposed on a suitable substrate to form a thermally-sensitive (or IR-sensitive) imageable layer. The imageable elements may have any utility wherever there is a need for an applied coating that is crosslinkable using suitable infrared radiation, and particularly where it is desired to remove non-exposed regions of the coating instead of exposed regions. The IR radiation-sensitive compositions can be used to prepare printed forms such as lithographic printing plate precursors that are defined in more detail below.

The imageable elements have one or more filter dyes in the imageable layer. These filter dyes have a $\lambda_{max}$ of from about 300 to about 500 nm or typically from 325 to 475 nm. They are present only in the imageable layer in an amount so that the white light stability of the imageable element satisfies the following inequality:

$$WLS > 3(WLS_0)$$

wherein WLS represents the white light stability of the imageable element containing the filter dye, and $WLS_0$ represents the white light stability of an imageable element that is different only in that the filter dye has been omitted.

In some embodiments, the white light stability can satisfy the following inequality:

$$WLS > 5(WLS_0).$$

The white light stability test can be carried out as follows:

An imageable element prepared according to the present invention and a "control" imageable element that is exactly the same in all aspects except that the filter dye has been omitted, are each exposed to white light tubes emitting 1,000 lux at 23±2° C. and a relative humidity was kept at 30±2%. This exposure is carried out until the sample becomes fogged after development (coating residues remain in the non-imaged regions).

In addition, the filter dye can be present at most in an amount to satisfy the following inequality:

$$E > 0.7(E_0)$$

wherein E is the exposure energy (mJ/cm$^2$) at 750 to 1400 nm required to prevent the imageable layer from being removed by treatment with a processing solution at 18 to 32° C. for 10 to 30 seconds, and $E_0$ is the exposure energy at 750 to 1400 nm required to prevent an imageable layer that differs from the imageable layer only in that the filter dye has been omitted, from being removed by the same processing solution treatment.

Particularly useful filter dyes include but are not limited to, azo dye, indolenine methine dye, hydroxybenzophenone derivative, triazine, benzotriazole derivative, aromatic nitro compound, quinone derivative, acridine derivative, pyrazolone derivative, or thiazole dye.

Useful azo dyes include but are not limited to, 4-phenylazodiphenylamine, 1-(2-pyridylazo)-naphthol-2,4-phenylazophenol, 6'-butoxy-2,6-diamino-3,3'-azopyridine, 4-dimethylamino-2-methylazobenzene, 4-(4-nitrophenylazo) resorcinol, 4-phenylazoaniline, 4-(2-pyridylazo) resorcinol, 1-phenylazo-2-naphthol, 1-phenylyazio resorcinol, Metanil Yellow, Basic Orange 2, Disperse Yellow 3, Disperse Yellow 5, Disperse Yellow 7, Disperse Yellow 9, Yellow 14, Acid Yellow 17, Acid Yellow 25, Acid Yellow 29, Acid Yellow 34, Acid Yellow, 40, Acid Yellow 42, Acid Orange 51, Acid Orange 63, Acid Orange 74, Direct Orange 31, Direct Yellow 8, Direct Yellow 27, Direct Yellow 29, Direct Yellow 50, Disperse Orange 1, Disperse Orange 3, Disperse Orange 25, Fat Brown B, Alizarin Yellow R, Mordant Orange 1, Mordant Yellow 7, Mordant Yellow 10, Mordant Yellow 12, Tartrazine, or any combination thereof.

Useful indolenine methine dyes include but are not limited to, Basic Yellow 11. Useful hydroxybenzophenone derivatives include but are not limited to, Chimacorb 81 from CIBA Specialities, useful triazines include Tinuvin 400 from CIBA Specialities, useful benzotriazole derivatives include but are not limited to, Tinuvin 1130, Tinuvin 900, Tinuvin 479, Tinuvin 328, Tinuvin 171, Tinuvin 109, and Tinuvin 99-2 from CIBA Specialities, useful aromatic nitro compounds include but are not limited to, Naphthol Yellow S, 2,4-dinitrole naphthol-1, Flavianic Acid, and Martius Yellow, useful quinone derivatives include but are not limited to, 4,5-dihydroxyanthraquinone-2-carboxylic acid, useful acridine derivatives include Solvent Orange 15 and Acridine Yellow G, useful pyrazolone derivatives include but are not limited to, Acid Yellow 11, and useful thiazole dyes include but are not limited to, Direct Yellow 59, Thiazole Yellow G, Thioflavin S, and Thioflavin T. Still other useful filter dyes include 2-alkyl alpha-cyano-4-(3-alkyl'oxazolin2-ylidene)crotonates, alpha-cyano-3,4-dialkoxycinnamic acid derivates, Curcumin, Quinoline Yellow A, and Quinoline Yellow S.

The filter dye can be present in the imageable layer in an amount of from about 0.02 to about 15 weight % (or typically from 0.5 to 5 weight % or from 0.75 to 4 weight %) based on dry imageable layer weight. The filter dyes are generally available from a number of commercial sources.

The imageable layers useful in this invention generally comprise an infrared radiation-sensitive imaging composition that includes one or more infrared radiation absorbing compounds. Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 4,973,572 (DeBoer et al.), 5,208, 135 (Patel et al.), 6,153,356 (Urano et al.), 6,264,920 (Achilefu et al.), 6,309,792 (Hauck et al.), and 6,787,281 (Tao et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Suitable dyes may be formed using conventional methods and starting materials or obtained from various commercial sources including American Dye Source (Baie D'Urfe, Quebec, Canada) and FEW Chemicals (Germany).

Some useful infrared radiation absorbing dyes have a tetraaryl pentadiene chromophore. Such chromophores generally include a substituted or unsubstituted pentadiene linking group having 5 carbon atoms in the chain, to which are attached two substituted or unsubstituted aryl groups at each end of the linking group.

Useful infrared radiation absorbing dyes can also be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the IR-sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to one skilled in the art, depending upon the specific compound used to provide the desired chromophore.

The IR radiation-sensitive composition (imageable layer) can include one or more polymeric binders that are generally used for off-press developability such as any alkaline solution soluble (or dispersible) polymer having an acid value of from about 20 to about 400 (typically from about 30 to about 200). The following described polymeric binders are useful in this manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly (alkylene oxide) (meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. Nos. 4,874,686 (Urabe et al.), 7,729,255 (Tao et al.), 6,916,595 (Fujimaki et al.), and 7,041,416 (Wakata et al.) that are incorporated by reference, especially with respect to the general formulae (1) through (3) noted in EP 1,182,033A1.

V. Polymeric binders can have pendant 1H-tetrazole groups as described in U.S. Application Publication 2009/0142695 (noted above) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. Nos. 6,309,792 (Hauck et al.), 6,352,812 (Shimazu et al.), 6,569,603 (noted above), and 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxylethyl methacrylate)/acrylonitrile/N-phenyl maleimide, and copolymers derived from N-methoxymethyl methacrylamide/methacrylic acid/acrylonitrile/n-phenyl maleimide are useful.

Other useful polymeric binders are particulate poly(urethane-acrylic) hybrids that are distributed (usually uniformly) throughout the imageable layer. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

Other polymeric binders are used to promote on-press developability, and include but are not limited to, those that are not generally crosslinkable and are usually present as discrete particles (not-agglomerated). Such polymers can be present as discrete particles having an average particle size of from about 10 to about 500 nm, and typically from 100 to 450 nm, and that are generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight ($M_n$) of at least 30,000 and typically at least 50,000 to 100,000, or from about 60,000 to about 80,000, as determined by refractive index.

Useful particulate polymeric binders generally include polymeric emulsions or dispersions of polymers having hydrophobic backbones to which are attached pendant poly (alkylene oxide) side chains, cyano side chains, or both, that are described for example in U.S. Pat. Nos. 6,582,882 (Pappas et al.), 6,899,994 (Huang et al.), 7,005,234 (Hoshi et al.), and 7,368,215 (Munnelly et al.) and US Patent Application Publication 2005/0003285 (Hayashi et al.) that are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 to 500,000, or from about 100,000 to about 300,000, as determined by dynamic light scattering.

The polymeric binder is generally present in the IR radiation-sensitive composition (and imageable layer) in an amount of at least 5 and up to 70 weight %, and typically from about 10 to about 50 weight % based on the total solids in the composition and layer.

Useful IR-radiation sensitive compositions are described, for example, in the following patent, publications, and copending patent applications, all of which are incorporated herein by reference:

U.S. Pat. No. 7,452,638 (Yu et al.),
U.S. Patent Application Publication 2008/0254387 (Yu et al.),
U.S. Patent Application Publication 2008/0299488 (Yu et al.),
U.S. Patent Application Publication 2008/0311520 (Yu et al.),
U.S. Ser. No. 12/104,544 (filed Apr. 17, 2008 by Ray et al.), and
U.S. Ser. No. 12/177,208 (filed Jul. 22, 2008 by Yu et al.).

Thus, the radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxy groups.

Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat Nos. 6,309,792 (Hauck et al.), 6,569,603 (Furukawa), and 6,893,797 (Munnelly et al.). Other useful free radically polymerizable components include those described in U.S. Patent Application Publication 2009/0142695 (Bauman et al.) that include 1H-tetrazole groups.

In addition to, or in place of the free radically polymerizable components described above, the radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The one or more free radically polymerizable components (monomeric, oligomeric, or polymeric) can be present in the imageable layer in an amount of at least 10 weight % and up to 80 weight %, and typically from about 20 to about 50 weight %, based on the total dry weight of the imageable layer. The weight ratio of the free radically polymerizable component to the total polymeric binders (described below) is generally from about 5:95 to about 95:5, and typically from 10:90 to 90:10, or even from 30:70 to 70:30.

This radiation-sensitive composition also includes an initiator composition that includes one or more initiators that are capable of generating free radicals sufficient to initiate polymerization of all the various free radically polymerizable components upon exposure of the composition to imaging radiation. The initiator composition is generally responsive to imaging radiation corresponding to the spectral range of from 700 nm and up to and including 1400 nm (typically from 750 to 1250 nm). Initiator compositions are used that are appropriate for the desired imaging wavelength(s).

Useful initiator compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl) [4-(2-methylpropyl)phenyl]iodonium hexafluorophosphate and is supplied in a 75% propylene carbonate solution.

Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

The iodonium cations and boron-containing anions are generally present in the imageable layer in a combined amount of at least 1% and up to and including 15%, and typically at least 4 and up to and including 10%, based on total dry weight of the imageable layer.

The radiation-sensitive composition (imageable layer) can further comprise one or more phosphate (meth)acrylates each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.).

The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The negative-working lithographic printing plate precursors can be formed by suitable application of an infrared radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition.

The element can also include what is conventionally known as an overcoat (or an oxygen barrier or oxygen impermeable topcoat) applied to and disposed over the imageable layer for example, as described in WO 99/06890 (Pappas et al.). Such topcoats generally comprise one or more hydrophilic or water-soluble polymers such as a poly(vinyl alcohol), poly(vinyl pyrrolidone), poly(ethyleneimine), or poly (vinyl imidazole), copolymers of two or more of vinyl pyrrolidone, ethyleneimine, and vinyl imidazole in an amount of at least 50 weight % (or at least 90 weight %) based on total topcoat dry weight. The topcoat generally has a dry coating weight of from about 0.2 to about 2.5 g/m² or from about 0.5 to about 2 g/m², in which the water-soluble polymer(s) comprise at least 50% and up to 100% of the dry weight of the overcoat. However, as noted above, the crosslinked polymeric particles having grafted hydrophilic polymeric groups can be present in the topcoat in an amount of at least 0.001 g/m² that can represent at least 0.5% solids of the topcoat dry weight. A poly(vinyl alcohol) can be the predominant polymeric binder (at least 50 weight % of total binders). No filter dyes are purposely incorporated into the topcoat.

There can be an interlayer between the imageable layer and the topcoat, if present. Such an interlayer comprises a suitable polymeric binder as is known in the art. However, such interlayers do not purposely include any filter dyes as described above.

The substrate generally has a hydrophilic surface, or at least a surface that is more hydrophilic than the applied infrared radiation-sensitive composition on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use. Typically, the support can be any self-supporting aluminum-containing material including aluminum sheets.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and phosphoric acid anodized aluminum support that provides a hydrophilic surface for lithographic printing.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], poly(acrylic acid), or an acrylic acid copolymer to increase hydrophilicity. Still further, the aluminum support may be treated with a phosphate solution that may further contain an inorganic fluoride (PF). The aluminum support can be electrochemically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm. The substrate can also be a cylindrical aluminum surface having the radiation-sensitive composition applied thereon, and thus be an integral part of the printing press. The use of such imaging cylinders is described for example in U.S. Pat. No. 5,713,287 (Gelbart).

The infrared radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the infrared radiation-sensitive composition is applied and dried to form an imageable layer and an overcoat formulation can be applied directly to that layer.

Illustrative of such manufacturing methods is mixing the various components needed for a specific imaging chemistry including polymeric binder, and infrared radiation absorbing compound, and any other components of the infrared radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 g/m² or at least 0.5 and up to and including 3.5 g/m².

Layers can also be present under the imageable layer to enhance developability or to act as a thermal insulating layer. Such underlayers do not purposely include filter dyes as described above.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the negative-working imageable elements can be enclosed in water-impermeable material that substantially inhibits the transfer of moisture to and from the element and "heat conditioned" as described in U.S. Pat. No. 7,175,969 (noted above) that is incorporated herein by reference.

Imaging Conditions

During use, the imageable element is exposed to a suitable source of infrared or near-infrared imaging or exposing radiation depending upon the infrared radiation absorbing compound present in the radiation-sensitive composition, at a wavelength of from about 700 to about 1400 nm. For example, imaging can be carried out using imaging or exposing radiation, such as from an infrared laser (or array of lasers) at a wavelength of at least 750 nm and up to and including 1400 nm and typically at least 750 nm and up to and including 1250 nm. Imaging can be carried out using imaging radiation at multiple wavelengths at the same time if desired.

The laser used to expose the imageable element is usually a diode laser (or array of lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Development and Printing

After thermal imaging, the elements can be heated by radiation, convection (such as in an oven), contact with a heated surface (such as heated rollers), or immersion in a heated bath of water. Generally, the heating temperature is from about 120 to about 150° C. or typically from 125 to 145° C. The time for heating can vary widely up to two minutes depending upon the method of heating that is to be used. Usually, the time of heating is from about 30 to about 90 seconds or typically from 35 to 85 seconds.

The imaged and heated elements can be processed "off-press" using the single processing solution described herein. Processing is carried out for a time sufficient to remove predominantly only the non-exposed regions of the outermost imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

As one skilled in the art would understand, the best developers for imaged negative-working precursors will likely be different depending upon the imaging chemistry that may be used. A skilled worker would be able to determine from the level of skill and teaching in the art which developers are best with a given type of imaged precursor.

The processing solutions generally include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of such solutions is generally from about 4 to about 14 or typically from 6 to 13. Aqueous alkaline developers and organic solvent-containing alkaline developers are particular useful.

Organic solvent-containing alkaline developers are generally single-phase solutions of one or more organic solvents that are miscible with water, and generally have a pH below 12. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15%, or typically from 1 to 12%, based on total developer weight.

Representative organic solvent-containing alkaline developers include ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa).

Useful aqueous alkaline developers generally have a pH of at least 7 and preferably of at least 11 and up to 13.5. Such developers include but are note limited to, 3000 Developer, 9000 Developer, Goldstar® Developer, Goldstar® Plus Developer, Goldstar® Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo), and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. Examples of such compounds and representative sources, tradenames, or methods of preparing are described for example in U.S. Pat. No. 6,649,324 (Fiebag et al.).

Processing solutions having a pH of from 4 to 11.5 are also useful for developing imaged precursors in the absence of post-rinse and gumming steps after development (so called "single bath development"). Such processing solutions contain in most cases hydrophilic polymers like gum Arabic, polyvinyl alcohol, poly(acrylic acid), or other hydrophilic polymers to protect the developed plate against fingerprints and to prevent toning of the plate when used on a printing press.

Generally, a processing solution is applied to the imaged precursor by rubbing or wiping the outer layer with an applicator containing the developer. Alternatively, the imaged precursor can be brushed with the processing solution or it may be applied by spraying the outer layer with sufficient force to remove the exposed regions. Still again, the imaged precursor can be immersed in the procession solution. In all instances, a developed image is produced in a lithographic printing plate having excellent resistance to press room chemicals. These development processes can be carried out in suitable developing processors or equipment using standard residence times and recirculation and replenishment rates.

Following this off-press development, the resulting lithographic printing plate can be rinsed with water and dried in a suitable fashion. The dried printing plate can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the printing plate.

In alternative embodiments, with or without a post-exposure baking step after imaging and before development, the imaged precursors can be developed "off-press" using a gum processing solution or single bath developer as described below. A gum solution is typically an aqueous liquid that comprises one or more surface protective compounds capable of protecting the lithographic image of the printing plate against contamination (for example, oxidation, fingerprints, dust or scratches). The gums useful in the practice of these embodiments would be generally considered "pre-bake" gums, and thus, usually lack the hydrophilic polymers.

The gum may be provided in diluted or concentrated form. The amounts of components described below refer to amount in the diluted gum that is likely its form for use. However, it is to be understood that concentrated gums can be used and the amounts of various components (such as the anionic surfactants) would be correspondingly increased.

The gum is an aqueous solution that generally has a pH greater than 3 and up to about 9 as adjusted using a suitable amount of a base. The viscosity of the gum can be adjusted to a value of from about 1.7 to about 5 cP by adding a suitable amount of a viscosity increasing compound such as a poly(vinyl alcohol) or poly(ethylene oxide).

In addition, these gums have one or more anionic surfactants even though optional components (described below) can be present if desired. Useful anionic surfactants include those with carboxylic acid, sulfonic acid, or phosphonic acid groups (or salts thereof). Anionic surfactants having sulfonic acid (or salts thereof) groups are particularly useful. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from 3 to 30 weight % (based on the weight of the gum).

Two or more anionic surfactants ("first", "second", etc.) can be used in combination. In such mixtures, a first anionic surfactant, such as an alkyldiphenyloxide disulfonate, can be present generally in an amount of at least 1 weight % and typically from 3 to 30 weight %. A second surfactant can be present (same or different from the first anionic surfactant) in a total amount of at least 0.1 weight %, and typically from 2 to 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The gums may include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglycol. These nonionic surfactants can be present in an amount of up to 10 weight %, but at usually less than 2 weight %.

Other optional components of the gum include inorganic salts (such as those described in [0032] of U.S. Patent Application 2005/0266349, noted above), wetting agents (such as a glycol), a metal chelating agents, antiseptic agents, antifoaming agents, ink receptivity agents (such as those described in [0038] of US '349), and viscosity increasing agents as noted above. The amounts of such components are known in the art. Calcium ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines may also be useful. A chelating agent may be present in the gum in an amount of from about 0.001 to about 1 weight %.

Generally, the gum is applied to the imaged precursor by rubbing, spraying, jetting, dipping, coating, or wiping the outer layer with the gum or a roller, impregnated pad, or applicator containing the gum. For example, the imaged precursor can be brushed with the gum, or the gum may be poured on or applied by spraying the outer layer with sufficient force to remove the exposed regions using a spray nozzle system as described for example in [0124] of EP 1,788,431A2 (noted above). Still again, the imaged precursor can be immersed in the gum and rubbed by hand or with an apparatus.

The gum can also be applied in a gumming unit (or gumming station) that has at least one roller for rubbing or brushing the printing plate while the gum is applied during development. By using such a gumming unit, the non-exposed regions of the imaged layer may be removed from the substrate more completely and quickly. The gum used in development can be collected in a tank and the gum can be used several times, and replenished if necessary from a reservoir of gum. The gum replenisher can be of the same concentration as that used in development, or be provided in concentrated form and diluted with water at an appropriate time.

Following off-press development, a postbake operation can be carried out, with or without a blanket or floodwise exposure to UV or visible radiation. The lithographic printing plate can be baked in a postbake operation to increase run length of the resulting imaged element. Baking can be carried out, for example at from about 170° C. to about 240° C. (typically from 175 to 230° C.) for from about 5 to about 12 minutes (typically from 7 to 10 minutes), or at about 120° C. for 30 minutes. Alternatively, a blanket UV or visible radiation exposure can be carried out, without a postbake operation.

Printing can be carried out by applying a lithographic ink and fountain solution to the printing surface of the lithographic printing plate. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The printing plates can be cleaned between impressions, if desired, using conventional cleaning means.

With or without a post-exposure baking step after imaging and before development, the imaged elements can be developed "on-press". In most embodiments, a post-exposure baking step is omitted. On-press development allows the imaged element to be mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The present invention provides at least the following embodiments and combinations thereof:

1. A negative-working imageable element comprising a substrate and having thereon an imageable layer that is sensitive to imaging radiation of from about 750 to about 1400 nm, the imageable layer comprising:

(1) an infrared radiation absorbing compound having a $\lambda_{max}$ of from about 750 to about 1400 nm, (2) a polymeric binder, (3) a free radical polymerizable compound, (4) a composition that provides free radicals in response to exposure to infrared radiation, and (5) a filter dye having a $\lambda_{max}$ of from about 300 to about 500 nm and that is present only in the imageable layer in an amount so that the white light stability of the imageable element satisfies the following inequality:

$$WLS > 3(WLS_0)$$

wherein WLS represents the white light stability of the imageable element containing the filter dye, and $WLS_0$ represents the white light stability of an imageable element that is different only in that the filter dye has been omitted.

2. The imageable element of embodiment 1 wherein its white light stability satisfies the following inequality:

$$WLS > 5(WLS_0).$$

3. The imageable element of embodiment 1 or 2 wherein the filter dye is present at most in an amount to satisfy the following inequality:

$$E > 0.7(E_0)$$

wherein E is the exposure energy (mJ/cm²) at 750 to 1400 nm required to prevent the imageable layer from being removed by treatment with a processing solution at 18-32° C. for 10-30 seconds, and $E_0$ is the exposure energy at 750 to 1400 nm required to prevent an imageable layer that differs from the imageable layer only in that the filter dye has been omitted, from being removed by the same processing solution treatment.

4. The imageable element of any of embodiments 1 to 3 wherein the filter dye is an azo dye, indolenine methine dye, hydroxybenzophenone derivative, triazine, benzotriazole derivative, aromatic nitro compound, quinone derivative, acridine derivative, pyrazolone derivative, or thiazole dye.

5. The imageable element of any of embodiments 1 to 4 wherein the filter dye is present in the imageable layer in an amount of from about 0.02 to about 15 weight % based on dry imageable layer weight.

6. The imageable element of any of embodiments 1 to 5 wherein the infrared radiation absorbing compound in an IR dye having a $\lambda_{max}$ of from 750 to 1250 nm.

7. The imageable element of any of embodiments 1 to 6 further comprising an oxygen barrier topcoat disposed over the imageable layer.

8. The imageable element of embodiment 7 wherein the oxygen barrier topcoat is disposed directly on the imageable layer.

9. The imageable element of embodiment 8 wherein the oxygen barrier topcoat contains no filter dyes.

10. The imageable element of any of embodiments 7 to 9 further comprising an interlayer between the oxygen barrier topcoat and the imageable layer, which interlayer contains no filter dyes.

11. The imageable element of any of embodiments 1 to 10 that is a lithographic printing plate precursor having an aluminum-containing substrate.

12. The imageable element of embodiment 1 that is a lithographic printing plate precursor having an aluminum-based substrate, and the imageable layer is sensitive to imaging radiation of from 750 to 1250 nm, and comprises:

a free radically polymerizable monomer, oligomer, or polymer, an IR dye having a $\lambda_{max}$ of from 750 to 1250 nm, an initiator that provides free radicals upon exposure to infrared radiation, a polymeric binder comprising pendant ethylenically unsaturated polymerizable groups, and a filter dye that is an azo dye and that is present in the imageable layer in an amount of from about 0.5 to about 5 weight % based on dry imageable layer weight, and the imageable element further comprising an oxygen barrier topcoat disposed directly on the imageable layer, which topcoat comprises a poly(vinyl alcohol).

13. The imageable element of any of embodiments 1 to 12 that is on-press developable.

14. A method of providing an imaged element comprising:

A) imagewise exposing the imageable element of any of embodiments 1 to 13 to radiation of from about 750 to about 1400 nm to provide both exposed and non-exposed regions in the imageable layer, and B) removing the non-exposed regions of the imageable layer.

15. The method of embodiment 14 wherein the non-exposed regions of the imageable layer are removed off-press using an alkaline developer or a gum solution.

16. The method of embodiment 14 or 15 that provides a lithographic printing plate having a hydrophilic aluminum-containing substrate.

17. A lithographic printing plate obtained from the method of any of embodiments 14 to 16.

18. The method of embodiment 14 or 16 wherein the non-exposed regions are removed on-press using a lithographic printing ink, fountain solution, or both a lithographic printing ink and fountain solution.

The following examples are provided to illustrate the practice of this invention and are not meant to be limiting in any way.

EXAMPLES

The following components were used in the examples:

| | |
|---|---|
| AYG | Acridine Yellow G |
| | Copolymer of methyl methacrylate/allyl methacrylate/methacrylic acid molar ratio of 20/60/20 |

-continued

| | |
|---|---|
| DMAMABS | 4-Dimethylamino-azobenzene-4 sulfonic acid |
| IR Dye 1 | 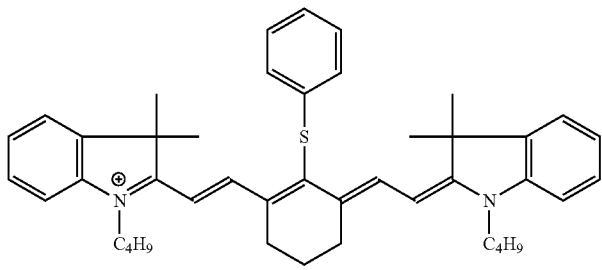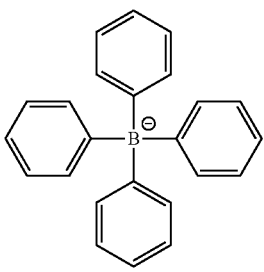 [SMILES: c1ccc([B-](c2ccccc2)(c2ccccc2)c2ccccc2)cc1] |
| IR Dye 2 | 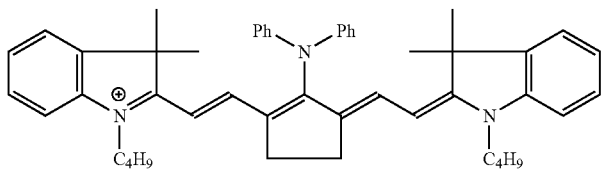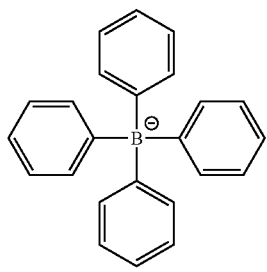 [SMILES: c1ccc([B-](c2ccccc2)(c2ccccc2)c2ccccc2)cc1] |
| HEMA | 2-Hydroxyethyl)methacrylate |
| HEPi | 2-(2-Hydroxyethyl)piperidine |
| HMDI | Hexamethylene diisocyanate |
| Kayamer PM-2 | Ester of 1 mol phosphoric acid and 1.5 mol hydroxyethyl-methacrylate, (Nippon Kayaku, Japan) |
| Metanil Yellow | 3-(4'-Anilinophenylazo)-1-benzene sulfonic aicd |
| Monomer 1 | Mixture of 1 part of NK-Ester BPE-200 (ethoxylated bisphenol A having methacrylic end groups (Shin Nakamura, Japan) and 3 parts of a 80% solution in methyl ethyl ketone of an oligomer prepared by reacting Desmodur ® N100 (trifunctional isocyanate (biuret of hexamethylene diisocyanate) (Bayer, Germany) with hydroxyethyl acrylate and pentaerythritol triacrylate; amount of double bonds: 0.5 double bonds per 100 g, when all isocyanate groups are reacted |
| Monomer 2 | Mixture of 1 part of NK-Ester BPE-500 (ethoxylated bisphenol A having methacrylic end groups (Shin Nakamura, Japan) and 4 parts of an oligomer solution of 30 weight % in methyl ethyl ketone of an oligomer made by reaction of HMDI + HEMA + HEPi |
| NPAR | 4-(4-Nitrophenyl)azoresorcinol |
| PADA | 4-Phenylazodiphenylamine |
| PAN | 1-(2-Pyridylazo)-naphthole-2 |
| Pigment 1 | Dispersion in propylene glycol monomethyl ether containing 9 wt. % of copper phthalocyanine and 1 wt. % of a poly(vinyl acetal) binder containing 39.9 mol % vinyl alcohol, 1.2 mol % vinyl acetate, 15.4 mol % acetal groups from acetaldehyde, 36.1 mol % acetal groups from butyraldehyde and 7.4 acetal groups from 4-formylbenzoic acid |

| | |
|---|---|
| QY | Quinoline Yellow |
| TFS | Thioflavin S |
| SDY146 | Sudan Yellow 146 |

Invention Examples 1-7 and Comparative Examples 1-3

An electrochemically roughened and anodized aluminum foil with an oxide weight of 3 g/m² was subjected to a post treatment using an aqueous solution of poly(vinyl phosphoric acid). The average roughness of the surface was 0.55 µm. Each of the coating compositions corresponding to TABLE I and II was applied to the substrate after filtering with a wire bar coater to provide imageable layers. The coatings were dried for 4 minutes at 90° C. to provide a dry weight of 1.4 g/m².

Each dried imageable layer was overcoated with an aqueous solution of poly(vinyl alcohol) (Celvol® 203 from Air Products, having a hydrolysis degree of 88%) with a wire bar coater to provide lithographic printing plate precursors with a topcoat dry coating weight of 1.2 g/m² after drying for 4 minutes at 90° C. The coating weight of the poly(vinyl alcohol) topcoat layer was 1 g/m².

The UGRA/FOGRA Postscript Strip version 2.0 EPS (available from UGRA), which contains different elements for evaluating the quality of the copies, was used for imaging the elements using a Trendsetter 3244 from Kodak (830 nm). The photospeed of the imaged elements was evaluated by exposure at different energies. The minimum energy required for the proper exposure of a 1-pixel circular line was defined as the photospeed of the element.

After washing off the water-soluble overcoat with water, the imaged elements were developed using the Kodak 980 developer. The photospeed of the "aged" element was measured in the same way. Aging was achieved by placing the elements in an oven for 16 hours at 60° C.

The white light stability was measured with white light tubes emitting 1,000 lux. During the white light exposure the temperature was 23±2° C. and the relative humidity was kept at 30±2%. The amount of white light expressed as lux*min when the plates becomes fogged is defined as white light safety.

The data in TABLE II below show that the imageable elements of the present invention have a significantly improved white light stability using the filter dyes in the imageable layer and these filter dyes have only very little impact on photospeed.

TABLE I

| | |
|---|---|
| 32 ml | Propylene glycol monomethyl ether |
| 8 ml | Methyl ethyl ketone |
| 0.09 g | IR dye corresponding to TABLE II |
| 2.28 g | Binder 1 |
| 0.2 g | Kayamer PM-2 |
| 4.3 g | Monomer corresponding to TABLE II |
| 0.15 g | Bis(4-cumyl) iodonium tetraphenyl borate |
| 1.8 g | Pigment 1 |
| 0.15 g | 1H-1,2,4-triazole-5-thiol |
| X g | Filter dye corresponding to TABLE II |

TABLE II

| Element | IR Dye | Monomer | Filter Dye | Amount (X) of Filter Dye (g) | White Light Stability [lux*min] | Photospeed [mJ/cm²] | Photospeed of Aged Plates [mJ/cm²] |
|---|---|---|---|---|---|---|---|
| Invention Example 1 | 1 | 1 | PADA | 0.06 | >240,000 | 70 | 65 |
| Invention Example 2 | 2 | 1 | PADA | 0.06 | >240,000 | 70 | 66 |
| Invention Example 3 | 1 | 2 | PADA | 0.06 | >240,000 | 70 | 65 |
| Invention Example 4 | 1 | 1 | Metanil Yellow | 0.07 | >240,000 | 70 | 65 |
| Invention Example 5 | 1 | 1 | DMAMABS | 0.07 | >240,000 | 68 | 67 |
| Invention Example 6 | 1 | 1 | NPAR | 0.08 | >240,000 | 65 | 65 |
| Invention Example 7 | 1 | 1 | TFS | 0.06 | >240,000 | 67 | 65 |
| Invention Example 8 | 1 | 1 | QY | 0.06 | >240,000 | 70 | 66 |
| Invention Example 9 | 1 | 1 | AYG | 0.07 | >240,000 | 70 | 65 |
| Invention Example 10 | 1 | 1 | PAN | 0.06 | >240,000 | 68 | 65 |
| Invention Example 11 | 1 | 1 | SDY146 | 0.06 | >240,000 | 69 | 65 |
| Comparative Example 1 | 1 | 1 | — | — | 20,000 | 67 | 65 |
| Comparative Example 2 | 2 | 1 | — | — | 25,000 | 67 | 65 |
| Comparative Example 3 | 1 | 2 | — | — | 30,000 | 67 | 65 |

The invention has been described in detail with particular reference to certain preferred embodiments thereof, but it will be understood that variations and modifications can be effected within the spirit and scope of the invention.

The invention claimed is:

1. A negative-working imageable element comprising a substrate and having thereon an imageable layer that is sensitive to imaging radiation of from about 750 to about 1400 nm, the imageable layer comprising:
   (1) an infrared radiation absorbing compound having a $\lambda_{max}$ of from about 750 to about 1400 nm,
   (2) a polymeric binder,
   (3) a free radical polymerizable compound,
   (4) a composition that provides free radicals in response to exposure to infrared radiation, and
   (5) a filter dye having a $\lambda_{max}$ of from 300 to 475 nm and that is present only in the imageable layer in an amount so that the white light stability of the imageable element satisfies the following inequality:

$$WLS > 5(WLS_0)$$

wherein WLS represents the white light stability of the imageable element containing the filter dye, and $WLS_0$ represents the white light stability of an imageable element that is different only in that the filter dye has been omitted.

2. The imageable element of claim 1 wherein the filter dye is present at most in an amount to satisfy the following inequality:

$$E > 0.7(E_0)$$

wherein E is the exposure energy (mJ/cm$^2$) at 750 to 1400 nm required to prevent the imageable layer from being removed by treatment with a processing solution at 18-32° C. for 10-30 seconds, and $E_0$ is the exposure energy at 750 to 1400 nm required to prevent an imageable layer that differs from the imageable layer only in that the filter dye has been omitted, from being removed by the same processing solution treatment.

3. The imageable element of claim 1 wherein the filter dye is an azo dye, indolenine methine dye, hydroxybenzophenone derivative, triazine, benzotriazole derivative, aromatic nitro compound, quinone derivative, acridine derivative, pyrazolone derivative, or thiazole dye.

4. The imageable element of claim 1 wherein the filter dye is present in the imageable layer in an amount of from about 0.02 to about 15 weight % based on dry imageable layer weight.

5. The imageable element of claim 1 wherein the infrared radiation absorbing compound in an IR dye having a $\lambda_{max}$ of from 750 to 1250 nm.

6. The imageable element of claim 1 further comprising an oxygen barrier topcoat disposed over the imageable layer.

7. The imageable element of claim 6 wherein the oxygen barrier topcoat is disposed directly on the imageable layer.

8. The imageable element of claim 7 wherein the oxygen barrier topcoat contains no filter dyes.

9. The imageable element of claim 6 further comprising an interlayer between the oxygen barrier topcoat and the imageable layer, which interlayer contains no filter dyes.

10. The imageable element of claim 1 that is a lithographic printing plate precursor having an aluminum-containing substrate.

11. The imageable element of claim 1 that is a lithographic printing plate precursor having an aluminum-based substrate, and the imageable layer is sensitive to imaging radiation of from 750 to 1250 nm, and comprises:
   a free radically polymerizable monomer, oligomer, or polymer,
   an IR dye having a $\lambda_{max}$ of from 750 to 1250 nm,
   an initiator that provides free radicals upon exposure to infrared radiation,
   a polymeric binder comprising pendant ethylenically unsaturated polymerizable groups, and
   a filter dye that is an azo dye and that is present in the imageable layer in an amount of from about 0.5 to about 5 weight % based on dry imageable layer weight, and
   the imageable element further comprising an oxygen barrier topcoat disposed directly on the imageable layer, which topcoat comprises a poly(vinyl alcohol).

12. The imageable element of claim 1 that is a lithographic printing plate precursor having an aluminum-based substrate, and the imageable layer is the outermost layer, is sensitive to imaging radiation of from 750 to 1250 nm, and comprises:
   a free radically polymerizable monomer, oligomer, or polymer,
   an IR dye having a $\lambda_{max}$ of from 750 to 1250 nm,
   an initiator that provides free radicals upon exposure to infrared radiation,
   a polymeric binder comprising pendant ethylenically unsaturated polymerizable groups, and
   a filter dye is an azo dye and that is present in the imageable layer in an amount of from about 0.5 to about 5 weight % based on dry imageable layer weight.

13. The imageable element of claim 1 that is on-press developable.

14. A method of providing an imaged element comprising:
   A) imagewise exposing the imageable element of claim 1 to radiation of from about 750 to about 1400 nm to provide both exposed and non-exposed regions in the imageable layer, and
   B) removing the non-exposed regions of the imageable layer.

15. The method of claim 14 wherein the non-exposed regions of the imageable layer are removed off-press using an alkaline developer or a gum solution.

16. The method of claim 14 that provides a lithographic printing plate having a hydrophilic aluminum-containing substrate.

17. The method of claim 14 wherein the imageable element is a lithographic printing plate precursor having an aluminum-based substrate, and the imageable layer is sensitive to imaging radiation of from 750 to 1250 nm and comprises:
   a free radically polymerizable monomer, oligomer, or polymer,
   an infrared radiation absorbing compound in an IR dye having a $\lambda_{max}$ of from 750 to 1250 nm,
   an initiator provides free radicals upon exposure to infrared radiation,
   a polymeric binder comprising pendant ethylenically unsaturated polymerizable groups,
   the filter dye that is an azo dye and that is present in the imageable layer in an amount of from about 0.5 to about 5 weight % based on dry imageable layer weight, and
   the imageable element further comprising an oxygen barrier topcoat directly disposed over the imageable layer, which topcoat comprises a poly(vinyl alcohol).

18. The method of claim 14 wherein the imageable element is a lithographic printing plate precursor having an aluminum-based substrate, and the imageable layer is the outermost layer, is sensitive to imaging radiation of from 750 to 1250 nm, and comprises:
   a free radically polymerizable monomer, oligomer, or polymer, an infrared radiation absorbing compound in an IR dye having a $\lambda_{max}$ of from 750 to 1250 nm, an initiator that provides free radicals upon exposure to infrared radiation, a polymeric binder comprising pendant ethylenically unsaturated polymerizable groups, and a filter dye that is an azo dye and that is present in the imageable layer in an amount of from about 0.5 to about 5 weight % based on dry imageable layer weight.

19. The method of claim 14 wherein the non-exposed regions are removed on-press using a lithographic printing ink, fountain solution, or both a lithographic printing ink and fountain solution.

20. A lithographic printing plate comprising an aluminum-containing substrate having thereon imaged regions of an infrared radiation-sensitive imageable layer, wherein the aluminum-containing substrate is revealed where non-imaged regions of the infrared radiation-sensitive imageable layer have been removed, which imaged regions can take up ink, and which imaged regions comprise a filter dye having a $\lambda_{max}$ of from 300 to 475 nm and that is present in the imaged regions in an amount so that the white light stability of the imaged regions prior to exposure to infrared radiation satisfies the following inequality:

$$WLS > 5(WLS_0)$$

wherein WLS represents the white light stability of the imaged regions of the imageable element containing the filter dye, and $WLS_0$ represents the white light stability of an imageable element that is different only in that the filter dye has been omitted.

* * * * *